United States Patent [19]

Utsumi et al.

[11] Patent Number: 5,539,295
[45] Date of Patent: Jul. 23, 1996

[54] DEVICE FOR INDICATING THE STATE OF A SINGLE-PHASE ASYNCHRONOUS MOTOR

[75] Inventors: Yutaka Utsumi, Hiratsuka, Japan; Jean-Michel Orsat, Chatillon/Cluses, France

[73] Assignee: Somfy, France

[21] Appl. No.: 392,109

[22] Filed: Feb. 22, 1995

[30] Foreign Application Priority Data

Mar. 16, 1994 [FR] France ................................ 94 03096

[51] Int. Cl.⁶ ........................................................ H02P 1/44
[52] U.S. Cl. ............................ 318/791; 318/786; 318/783
[58] Field of Search .................................... 318/786, 785, 318/778, 787, 779, 747, 796, 791, 792, 783

[56] References Cited

U.S. PATENT DOCUMENTS 4,468,603  8/1984  Vander-Meer et al. ................ 318/779
4,604,563  8/1986  Min ......................................... 318/796
4,622,506  11/1986  Schenanske et al. ................... 318/785

FOREIGN PATENT DOCUMENTS 2168497  6/1986  United Kingdom .

*Primary Examiner*—John W. Cabeca
*Attorney, Agent, or Firm*—Laff, Whitesel, Conte & Saret, Ltd.

[57] ABSTRACT

Device for indicating the state of a single-phase asynchronous motor (MO) with a phase-shift capacitor, including an automatic stop switch (FC1, FC2) on each live conductor and a thermal switch (TH) on the return conductor, and the direction of rotation of which can be reversed by means of a changeover switch (CM). The indicator device consists of a current detector (DC), of a voltage detector (DT) and of processing logic (LT) respectively delivering information on the direction of rotation of the motor, the state of the live conductor switches and of the thermal switch.

7 Claims, 1 Drawing Sheet

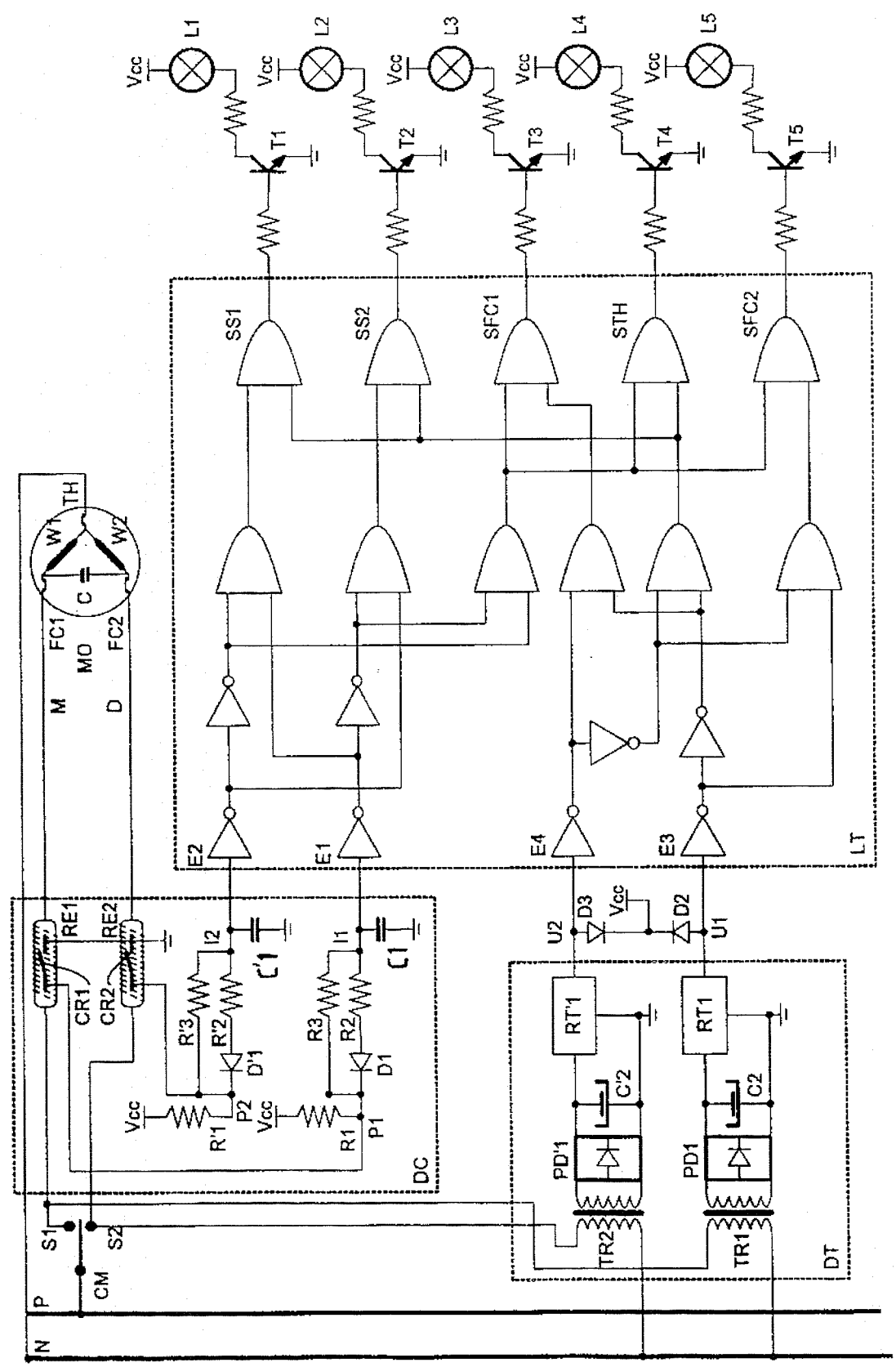

5,539,295

DEVICE FOR INDICATING THE STATE OF A SINGLE-PHASE ASYNCHRONOUS MOTOR

FIELD OF THE INVENTION

The invention relates to a device for indicating the state of a single-phase asynchronous motor with a phase-shift capacitor, including an automatic stop switch on each live conductor and a thermal switch on the return conductor, and the direction of rotation of which can be reversed by means of a changeover switch making it possible to apply the power supply voltage onto one or the other of the terminals of the phase-shift capacitor, in such a way that one or the other of the windings of the motor is working in main phase mode.

PRIOR ART

The motors involved are particularly the motors used to drive blinds, roller shutters or gates. Stop switches form part of devices for measuring the movement of the driven object which measure this movement by counting the number of revolutions of the motor. Such devices are described particularly in the Patents FR 2,455,695 and 2,688,022 and in the Patent EP 0,524,152. The changeover switch makes it possible either to cut off the power supply on the two live conductors, or to supply one or the other of these conductors in order to make the motor turn in one direction or the other. In their customary use, the switches determine the maximum opening and closing points of the driven object.

Such a motor can be in various states, namely those in which the motor is turning in one direction or the other, as the changeover switch, at the point of control, feeds one or the other of the live conductors, and those states in which the motor is stopped, since one or the other of the automatic stop switches or the thermal switch is open. In certain conditions of use, it is useful, or even necessary, to know the situation of the motor. This may, for example, be the need for monitoring or the need to trigger automated sequences in a synchronized way.

In order to fully determine the state of the motor, it is necessary to know the state of the live conductor switches, the state of the thermal switch, as well as the state of the direction changeover switch, since the motor may be stopped for the simple reason that the changeover switch is at the midpoint.

It is known, for example, from the document GB-A-2, 168,497, to measure the load on an induction motor by measuring the phase shift between the current and the voltage, but this measurement does not make it possible, however, to know the direction of rotation of the motor, nor the state of the live conductors and of the thermal switch.

SUMMARY OF THE INVENTION

In order to resolve this problem, it has been proposed to connect telltale conductors, at certain points of the motor, which conductors are brought out with the other conductors. These telltale conductors are linked through relays to the return conductor, the contacts of these relays feeding receivers. Two relays are connected directly on the live conductors starting from the terminals of the changeover switch for signaling the presence of a power supply voltage on one or the other of the terminals of the changeover switch. Two other relays are fed when the live conductor switches are opened, and a fifth relay is mounted in parallel with the thermal switch. This solution exhibits several drawbacks. First of all, the end-of-travel switches have to be replaced by reversing switches, which means a modification and a complication to standard equipment. Moreover, the motors require special more expensive manufacture, due to the added elements and the particular management which they generate. Finally, the presence on the housing of the motor of three additional outlet conductors has an interfering effect and it is a source of error when the motor is being connected by the installer.

The object of the invention is to produce an indicator device obviating the abovementioned drawbacks, that is to say an indicator requiring no modification to the motor, nor intervention in the latter, so that it can be used with a standard motor.

The indicator device according to the invention is characterized in that it comprises two current detectors respectively detecting the presence of current in each of the live conductors and each having an output capable of taking up two separate states, two voltage detectors respectively detecting the presence of a voltage on each of the terminals of the changeover switch, which are linked to the live conductors and each have an output capable of taking up two separate states, and processing logic, to the inputs of which the states of the voltage detectors and the current detectors are applied, this processing logic being configured in such a way as to analyze the various combinations of the states at the inputs and to deliver, on five outputs, signals which are representative of the state of the automatic stop switches, of the thermal switch and of the direction of rotation of the motor.

The current detectors are preferably produced from reed envelopes, by reason of their very low cost and of their ease of use. A few turns of the conductor wound around the envelope suffice to close its contact. The current and voltage detectors and the processing logic are advantageously mounted in a single independent housing which constitutes a self-contained accessory which it is easy to interpose between the point of control including the direction changeover switch and a standard motor, at any point, whether an already installed motor is involved, in the case of renovation, or not. In the case in which the current detectors, as well as the devices for displaying the state of the outputs of the processing logic, require a direct-current power supply, the direct-current power supply can be delivered by the voltage detectors.

BRIEF DESCRIPTION OF THE DRAWING

The attached drawing represents an embodiment of the invention, by way of example.

The single Figure of the drawing represents the diagram of the installation comprising the motor and the device for indicating the state of the motor.

DESCRIPTION OF THE PREFERRED EMBODIMENT

In the diagram represented, a single-phase asynchronous motor MO can be seen, comprising two phase windings W1 and W2 and a phase-shift capacitor C. In the housing of the motor, symbolized by a circle, there are also two end-of-travel switches FC1 and FC2, closed at rest onto the live conductors U and D, the conductors U and D being respectively considered as the "up" and "down" conductors, in the case of an application to driving a roller shutter. The devices for counting the number of rotations of the motor and for actuating the end-of-travel switches FC1 and FC2 are regarded as being integrated into the motor. The motor is furthermore equipped with a thermal switch TH on the return conductor linked directly to the neutral N of the mains, the live L of which is linked to the contact of a changeover switch CM placed at the point of control of the motor. The changeover switch CM comprises two terminals S1 and S2, to which the contact of the changeover switch can be linked, represented in midposition. The terminal S1 is linked to the live conductor U, while the terminal S2 is linked to the live conductor D. If the power supply voltage is applied to the conductor U, the winding W1 works in main phase mode and the winding W2 works in auxiliary phase mode, and the motor turns in a first direction. If the conductor D is powered, the winding W2 works in main phase mode and the winding W1 in auxiliary phase mode and the motor turns in the other direction.

The conductor U is wound, for a few turns, around a first reed envelope RE1 sheltering a contact CR1, while the conductor D is wound in the same way around a second reed envelope R2 sheltering a contact CR2. One of the terminals of the contact CR1 is linked to ground and the other terminal is linked, on the one hand, to a direct-current source Vcc through a resistor R1 and, on the other hand, to ground, in parallel with the contact CR1, through a diode D1, a resistor R2 and a capacitor C1, a third resistor R3 being connected in parallel to the diode D1 and to the resistor R2. The cathode of the diode D1 is linked to the terminal P1 of the resistor R1 linked to the reed contact CR1.

In a similar way, the contact CR2 of the second reed envelope is linked to an identical circuit consisting of the resistors R'1, R'2 and R'3, of a diode D'1 and of a capacitor C'1.

Each of these circuits constitutes a current detector DC on the corresponding live conductor. It will be sufficient to describe the operation of the current detector in the live conductor U.

In the absence of current, in the conductor U, the reed contact CR1 is open. The diode D1 is turned off and the capacitor C1 charges to the positive DC voltage Vcc through the resistors R1 and R3. The point I1, that is to say the terminal of the capacitor C1 linked to the resistors, takes up a first voltage level designated high level H. If a current passes through the conductor U, the contact CR1 closes, which has the effect of linking the point P1 to ground and the capacitor C1 discharges through the resistors R2 and R3 and the diode D1. The voltage at the point I1 falls to a low level L. In an identical way, the point I2 of the second current detector takes up an H or L level according to whether the contact CR2 of the second reed envelope is open or closed.

The voltage detectors DT will now be described.

The terminal S1 of the changeover switch CM is linked to one of the terminals of the primary winding of a transformer TR1, the other terminal of which is linked to the neutral N of the mains.

The secondary of the transformer TR1 is linked to a rectifier consisting of a diode bridge PD1 and of a smoothing capacitor C2. The voltage detector is completed by a voltage regulator RT1, consisting of a reference circuit 78L05. At the output of the voltage regulator RT1, the voltage U1 can take either a high level H, if the primary of the transformer TR1 is supplied with power or a low level L if this primary is not supplied with power.

A second, identical voltage detector, comprising a transformer TR2, is linked to the other terminal S2 of the changeover switch CM. The corresponding elements of this second voltage detector have been designated by the same references as in the first voltage detector with the sign. At the output of the voltage regulator RT'1, a voltage U2 is obtained having either a high level H, or a low level L.

The voltage detectors furthermore deliver the DC voltage Vcc through two opposed diodes D2 and D3.

The outputs of the current and voltage detectors are applied to four inputs E1, E2, E3 and E4 of processing logic LT consisting of eight NOT logic gates and eleven AND logic gates linked together according to the logic diagram represented. This processing logic unit LT has five outputs SS1, SS2, SFC1, SFC2 and STH. The output SS1 indicates that there is a voltage on the terminal S1 of the changeover switch CM. The output SS2 indicates that there is a voltage on the terminal S2. The output SFC1 indicates whether the switch FC1 is open or closed. The output SFC2 indicates whether the switch FC2 is open or closed. The output STH indicates whether the thermal switch TH is open or closed. The truth table corresponding to the logic diagram represented is as follows:

| OUTPUTS | U1 level | U2 level | I1 level | I2 level |
|---|---|---|---|---|
| SS1 rotation direction 1 | H | H | H | L |
| SS2 rotation direction 2 | H | H | L | H |
| STH thermal switch TH open | H | H | L | L |
| SFCI stop 15itch FC1 open | H | L | L | L |
| SFC2 stop switch FC2 open | L | H | L | L |

Each of the outputs of the processing logic LT controls the base of a transistor T1, respectively T1 to T5, operating as a switch for supplying power to a pilot light L1, respectively L2 to L5.

We claim:

1. A device for indicating a state of a single-phase asynchronous motor wherein said single-phase asynchronous motor has:

a phase-shift capacitor, an automatic stop switch (FC1, FC2) on each of a plurality of live conductors, each live conductor coupled to said motor, a first and second terminal (S1, S2) coupled to a changeover switch (CM), a first and second winding (W1, W2) of said motor coupled to said change over switch, a thermal switch (TH) on a return conductor, said return conductor coupled to said motor, a direction of rotation of the motor which can be reversed by said changeover switch (CM), said changeover switch connected to a power supply voltage and one of said first or second terminals (S1, S2) of the phase-shift capacitor (C), in such a way that one of said first or second windings (W1, W2) of the motor is working in a main phase mode; said device for indicating the state of the single-phase asynchronous motor, comprising:

two current detectors (DC) respectively detecting the presence of the current in each of the live conductors and each having an output (I1, I2) capable of taking up two separate states (H, L), two voltage detectors (DT) respectively detecting the presence of a voltage on each of the terminals (S1, S2) of the changeover switch, which are linked to the live conductors and each have an output (U1, U2) capable of taking up two separate states (H, L), and processing logic (LT), to plurality of inputs of which the states of the voltage and current detectors are applied, this processing logic being configured in such a way as to analyze various combinations of the logic states at the inputs and to deliver, on five outputs (SS1, SS2, SFC1, SFC2, STH), signals which are representative of the state of the automatic stop switches, of the thermal switch and of the direction of rotation of the motor.

2. The device as claimed in claim 1, wherein the current detectors (DC) each consist of a reed envelope (RE1, RE2), around which are wound a few turns of the live conductor, the current in which is to be detected, and of an associated circuit comprising a resistor (RR1) linked to a direct current source (Vcc) and in series with the reed contact (CR1, CR2), in such a way that it is linked to ground when the reed contact is closed, and wherein the voltage detectors (DT) each consist of a transformer (TR1, TR2) and of a rectifier also supplying the DC voltage (Vcc) for powering the current detectors.

3. The device as claimed in claim 2, wherein each voltage detector comprises a DC voltage regulator (RT).

4. The device as claimed in claim 2, wherein the circuit associated with each of the reed envelopes of the current detectors consists, in addition to the said resistor, of a diode (D1), of a second resistor (R2) and of a capacitor (C1) in parallel with the reed contact (CR1) and of a third resistor (R3) connected in parallel to the diode and to the second resistor.

5. The device as claimed in claim 4, wherein each voltage detector comprises a DC voltage regulator (RT).

6. The device as claimed in claim 1, which comprises means (L1 to L5) for displaying the state of the outputs of the processing logic.

7. The device as claimed in claim 1, wherein the current and voltage detectors and the processing logic are mounted in a common housing.

* * * * *

UNITED STATES PATENT AND TRADEMARK OFFICE
CERTIFICATE OF CORRECTION

PATENT NO. : 5,539,295
DATED : July 23, 1996
INVENTOR(S) : Yutaka Utsumi, Jean-Michel Orsat It is certified that error appears in the above-indentified patent and that said Letters Patent is hereby corrected as shown below:

Column 4, Line 67, add "a" after the word --to--.

Column 5, Line 13, delete "RR1" and insert --R1--.

Signed and Sealed this

First Day of October, 1996

Attest:

BRUCE LEHMAN

Attesting Officer

Commissioner of Patents and Trademarks